United States Patent [19]

Sawaya

[11] Patent Number: 4,951,124
[45] Date of Patent: Aug. 21, 1990

[54] SEMICONDUCTOR DEVICE

[75] Inventor: Hiromichi Sawaya, Kawasaki, Japan

[73] Assignee: Kabushiki Kaisha Toshiba, Kawasaki, Japan

[21] Appl. No.: 346,353

[22] Filed: Apr. 28, 1989

Related U.S. Application Data

[63] Continuation of Ser. No. 88,285, Aug. 24, 1987, abandoned.

[30] Foreign Application Priority Data

Oct. 24, 1986 [JP] Japan .................... 61-253215

[51] Int. Cl.$^5$ ..................... H01L 23/40; H01L 23/34; H01L 23/12; H01L 23/48
[52] U.S. Cl. ........................ 357/81; 357/68; 357/74
[58] Field of Search ............ 357/81, 80, 68, 74, 357/75; 165/80.3; 361/386, 406, 400, 405

[56] References Cited

U.S. PATENT DOCUMENTS

| | | | |
|---|---|---|---|
| 4,609,040 | 9/1986 | Moore | 357/81 |
| 4,611,389 | 9/1986 | Blair et al. | 357/81 |
| 4,691,765 | 9/1987 | Wozniczka | 165/80.3 |
| 4,707,726 | 11/1987 | Tinder | 357/81 |
| 4,709,302 | 11/1987 | Jordan | 357/81 |
| 4,710,852 | 12/1987 | Keen | 357/81 |
| 4,712,159 | 12/1987 | Clemens | 357/81 |

OTHER PUBLICATIONS

U.S. Ser. No. 121,955, filed on Nov. 18, 1987, entitled "Single In-Line Type Semiconductor Device".

Primary Examiner—Rolf Hille
Assistant Examiner—S. V. Clark
Attorney, Agent, or Firm—Finnegan, Henderson, Farabow, Garrett, and Dunner

[57] ABSTRACT

A single in line type semiconductors device is disclosed which has a plurality of lead-in wires extending from a package. In this semiconductor device, a heat sink is embedded in one surface of the package and an appropriate number of lead-in wires are bent on the other surface side of the package, to provide an offset array of the lead-in wires arranged in two rows. A projection is formed on the above appropriate number of lead-in wires on one surface side of the package, such that it extends in a direction perpendicular to that in which the lead-in wires extend. In this semi-conductor device, when the external lead-in wires are inserted into, and joined by means of soldering to a printed circuit board, the package is prevented from being inclined toward the heat sink side by the projection of the external lead-in wire, so that it may be set upright relative to the printed circuit board.

3 Claims, 3 Drawing Sheets

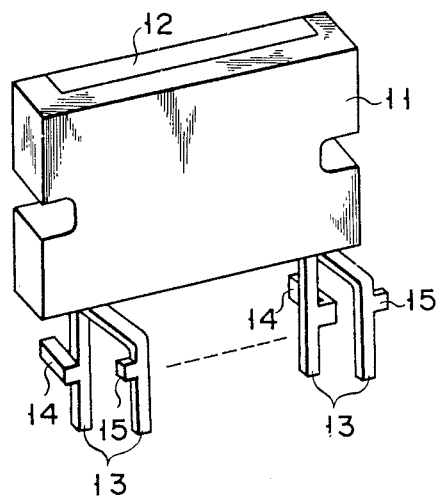
F I G. 3
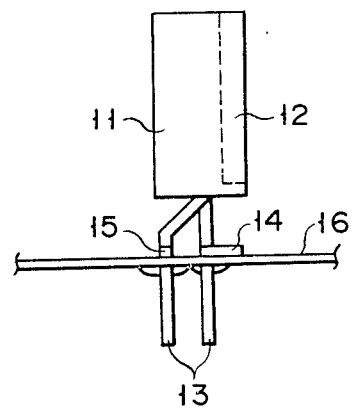
F I G. 4
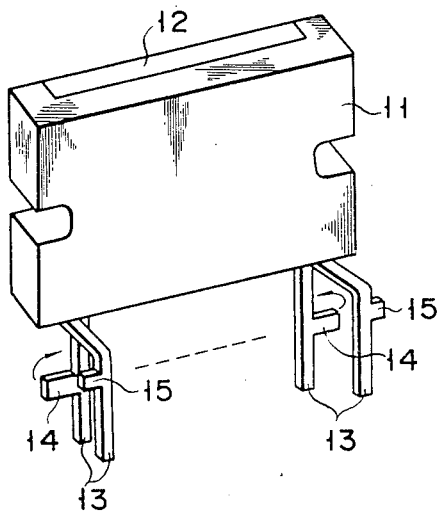
F I G. 5

SEMICONDUCTOR DEVICE

This application is a continuation of application Ser. No. 088,285, filed Aug. 24, 1987, now abandoned.

BACKGROUND OF THE INVENTION

This invention relates to a single in-line type semiconductor device having external lead-in wires arranged as an alternate offset array.

As a power integrated circuit for use in audio equipment and for motor control, for instance, a single in-line (SIL) type package is employed, which has a plurality of external lead-wires extending from one side of the package. There are two types of SIL package: (1) a lead straight type having external lead-in wires in a single array, and (2) an alternately offset type having a plurality of external lead wires arranged in two rows.

FIG. 1 is a side view, partly in section, showing an external appearance of a conventional offset pin type integrated circuit. Heat sink 22 made of metal is embedded in one surface of package 21 made of, for example, an insulating resin or ceramics. A plurality of external lead-in wires 23 extend from the bottom surface of package 21, and are alternately bent in the neighborhood of their base ends, in a direction opposite to that in which heat sink 22 is located. As a result, external lead-in wires 23 are arranged in two rows.

In the process of attaching an integrated circuit to an electronic device, the external lead-in wires are soldered to a printed circuit board, and the resultant structure is fixed to the heat sink by means of, for example, a screw.

FIG. 2 is a side view showing the aforementioned integrated circuit incorporated into an electronic device. In the arrangement shown in FIG. 2, reference numeral 31 represents a printed circuit board to which integrated circuit 20 and various elements are joined by soldering. Internal heat sink 33 is mounted on the case side of the electronic device, and serves also as an IC mounting plate. External heat sink 34 is fixed by screw 35 to internal heat sink 33.

When external heat sink 34 is to be attached to internal heat sink 33 by means of the screw, integated circuit 20 cannot be located currently unless it is set upright relative to printed circuit board 31.

However, heat sink 22 made of metal is placed on one surface side of integrated circuit 20 so that, upon the attachment of external lead-in wires 23 to the printed circuit board by soldering, integrated circuit 20 is fixed in a tilted fashion, as is shown in FIG. 2, due to a heavy weight being applied to that side of the package where heat sink 22 is located. Where external lead-in wires 23 are soldered to printed circuit board 31, with integrated circuit 20 not set upright over printed circuit board 31, stress is applied to integrated circuit 20 by the insertion of the screw. As a result, cracks may occur in the semiconductor pellet of integrated circuit 20. If integrated circuit 20 is erected by applying an undue force, then there is a possibility that a breakage will occur on the interconnection layer of the printed circuit board.

SUMMARY OF THE INVENTION

It is accordingly the object of this invention to provide a semiconductor device which can fixedly locate an integrated circuit in an exactly upright state over a printed circuit board, upon joining the external lead-in wires of the integrated circuit to the printed circuit board, by means of soldering and which can prevent the occurrence of cracks in a semiconductor pellet in the integrated circuit, as well as breakage of an interconnection layer on the printed circuit board, during assembly.

According to the present invention a semiconductor device is provided, comprising:

a package having a heat sink on one surface, and containing a semiconductor pellet;

a plurality of external lead-in wires extending from one surface of the package, and bent at a predetermined interval, in a direction opposite to that in which the heat sink is located, to provide an offset array of the aformentioned external lead-in wires arranged in two rows; and a projection formed on an appropriate number of the external lead-in wires, in a direction perpendicular to that in which the external lead-in wires extend, and extending on the heat sink side of the package.

When, in the semiconductor device of this invention, the external lead-in wire is inserted into, and joined by soldering to the printed circuit board, the package is prevented, by the projection of the external lead-in wire, from being tilted toward the heat sink side, so that the package is set upright over the printed circuit board.

In this way, it is possible to prevent the development of cracks on the semiconductor pellet, as well as breakage of the interconnection layer on the printed circuit board, during assembly.

BRIEF DESCRIPTION OF THE DRAWINGS

FIG. 3 is a perspective view showing a semiconductor device according to an embodiment of this invention;

FIG. 4 is an end view showing the state in which the semiconductor device of FIG. 2 is fixed to the printed circuit board;

FIG. 5 is a perspective view showing one of the states when the semiconductor device of this invention is manufactured;

DETAILED DESCRIPTION OF THE PREFERRED EMBODIMENT

Figure 1:
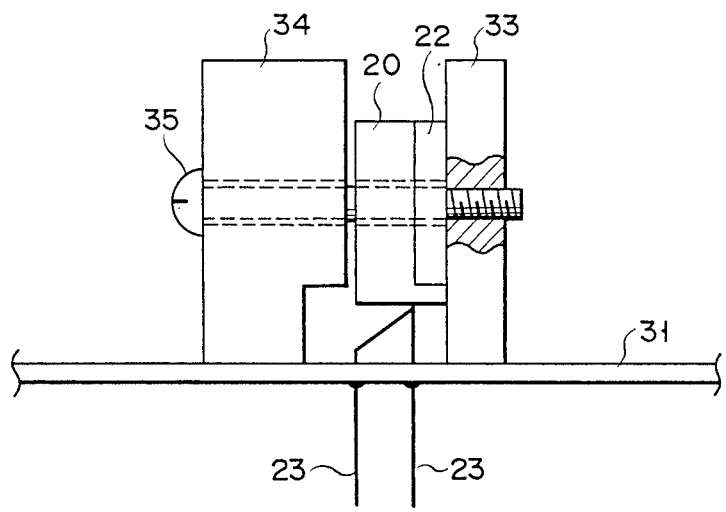
FIG. 1 is a view, partly in section, showing the state in which a conventional semiconductor device is mounted.
Figure 2:
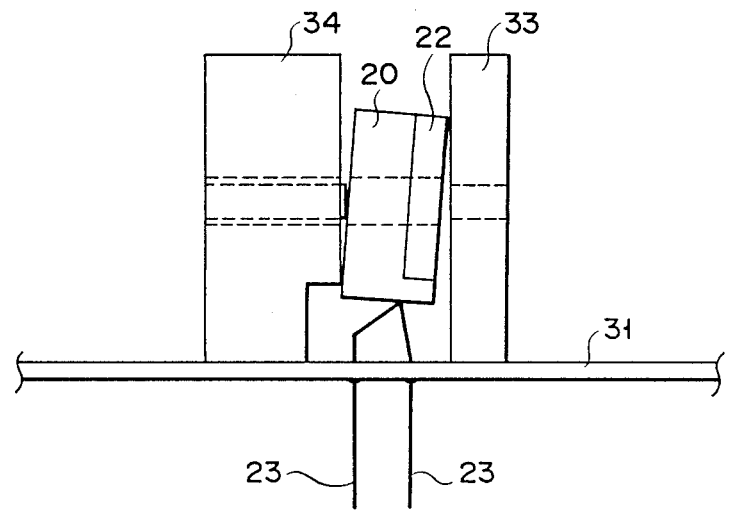
FIG. 2 is a view showing the state in which a printed circuit board is tilted when the conventional semiconductor device is attached to the conventional printed circuit board.

FIG. 3 is a perspective view showing an external appearance of a semiconductor device according to this invention. In FIG. 3, package 11 is made of, for example, an insulating resin or ceramics. Heat sink 12 made of metal is embedded on one surface of package 11. Within package 11, not shown, a semiconductor pellet is placed on heat sink 12. A plurality of external lead-in wires 13 are connected to the electrodes of the semiconductor pellet and extend from the bottom face of package 11. Alternate ones of external lead-in wires 13 are bent in a direction opposite to that in which heat sink 12 is located. In this way, external lead-in wires 13 are arranged in an offset fashion in two rows.

Projection 14 is provided on each outermost lead-in wire 13 in one of the two rows on the heat sink side of the package such that it extends in a direction perpendicular to the longitudinal direction of heat sink 12. Projection 15 is provided on each outermost lead-in wire 13 in the other row on that surface side of the package away from heat sink 12 such that is extends in a direction parallel to said other row of lead-in wires 13.

Where the semiconductor device of the aforementioned structure is to be incorporated into the electronic apparatus, external lead-in wires are inserted in the printed circuit board and then jointed by soldering to the printed circuit board. Then, the external heat sink is fixed in place by means of, for example, a screw.

With reference to FIG. 4, when the external lead-in wire is inserted into a corresponding hole of the printed circuit board in a case where the external lead-in wire is to be soldered to the printed circuit board, package 11 will tend toward the heat sink side of the package under the weight of heat sink 12. However, package 11 is prevented from tilting down toward heat sink 12 by projections 14 of the outermost lead-in wires 13 in said one row. Projections 14 perform the double function of (1) setting the semiconductor device in an upright position over printed circuit board 16 and (2) determining an amount of insertion of external lead-in wire 13 into the corresponding hole of printed circuit board 16. Similarly, projection 15 of the outermost lead-in wires 13 serve to determine an amount of insertion of lead-in wire 13 into the corresponding hole of printed circuit board 16.

In the semiconductor device according to the embodiment shown in FIG. 3, it is possible to prevent the external lead-in wires from tilting as in the prior art when the external lead-in wires is jointed to the printed circuit board by means of soldering. It is, therefore, possible to set the semiconductor device in an upright position over the printed circuit board at all times. As a result, it is possible to prevent development of cracks on the semiconductor pellet within the integrated circuit as encountered in the prior art semiconductor device. It is also possible to prevent the interconnection layer on the printed circuit board from being broken when an attempt is made to set the integrated circuit in the upright position over the printed circuit board by applying an undue force to the integrated circuit.

According to the semiconductor device of this invention, the semiconductor pellet is die bonded to heat sink 12 and external lead-in wires 13 are connected to the associated electrodes on the pellet. The resultant structure is subjected to, for example, a resin molding step to provide package 11. As shown in FIG. 5, selected ones of external lead-in wires 13 are bent on the side of package 11 on which heat sink 12 is located. In this way, external lead-in wires 13 may be arranged in two rows to provide an alternately offset array. Projection 14 on each outermost external lead-in wire 13 is bent in a direction indicated by an arrow in FIG. 5.

Figure 6:
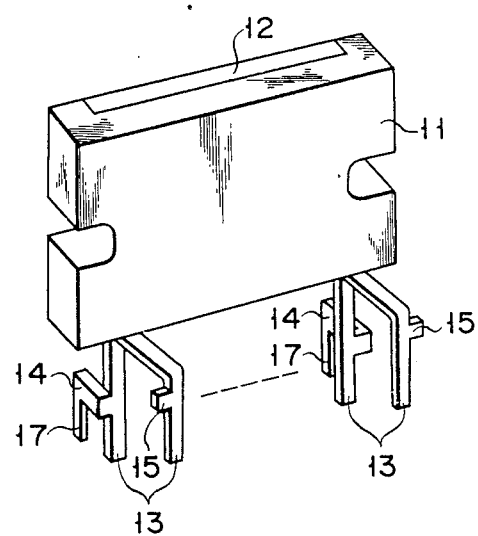
FIG. 6 is a perspective view showing a semiconductor device according to another embodiment of this invention.
Figure 7:
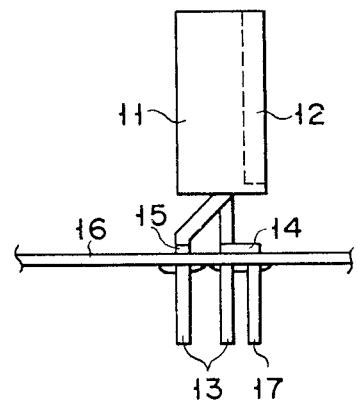
FIG. 7 is an end view showing the state in which the semiconductor device of FIG. 6 is mounted on a printed circuit board.

FIG. 6 is a perspective view showing a semiconductor device according to another embodiment of this invention. In this embodiment, extension 17 is provided on the forward end of projection 14 of the embodiment shown in FIG. 3 such that it extends in a direction in which external lead-in wires 13 extend. FIG. 7 is a side view showing the state in which the semiconductor device of FIG. 6 is jointed to printed circuit board by means of soldering.

In the embodiment shown in FIG. 6, package 11 is supported on printed circuit board 16 by not only projections 14 and 15 but also extension 14 of the external lead-in wires, so that the semiconductor device can readily be set in the upright position.

This invention is not restricted to the aformentioned embodiment and a variety of changes or modifications may be made without departing from the spirit and scope of this invention. For example, projection 14 may be formed on either one of the two outermost external lead-in wires located on the heat sink side of package 11 or projections 14 may be formed on all or alternate external lead-in wires on the external lead-in wires located on the heat-sink side of package 11.

What is claimed is:

1. A semiconductor device comprising:
    a package having a front surface, a back surface, and a bottom surface;
    a heat sink disposed in said front surface and a semiconductor pellet disposed between said front and back surfaces;
    a plurality of external lead-in wires extending from said bottom surface of said package, selected ones of said lead-in wires being bent at a predetermined interval toward said back surface of said package to form a first row of external lead-in wires, the remaining ones of said external lead-in wires forming a second row offset with respect to said first row; and
    projection means, formed on selected ones of said second row of external lead-in wires, for offsetting a force applied to said external lead-in wires by the weight of said heat sink to thereby prevent tilting of said package about said external lead-in wires and to prevent subsequently formed cracks in said pellet when the tilting is forcibly reversed, said projection means extending substantially perpendicular to respective ones of said outermost external lead-in wires toward said front surface of said package.

2. A semiconductor device according to claim 1, wherein each said projection includes a distal end portion extending substantially parallel to said outermost external lead-in wires.

3. A semiconductor device according to claim 1, wherein said projection is formed on each of said external lead-in wires of said second row.

* * * * *